United States Patent [19]
Fisher et al.

[11] Patent Number: 5,757,822
[45] Date of Patent: May 26, 1998

[54] BIT-INTERLEAVED RATE 16/17 MODULATION CODE WITH THREE-WAY BYTE-INTERLEAVED ECC

[75] Inventors: Kevin D. Fisher, Palo Alto; Pablo A. Ziperovich, San Jose, both of Calif.

[73] Assignee: Quantum Corporation, Milpitas, Calif.

[21] Appl. No.: 518,945

[22] Filed: Aug. 24, 1995

[51] Int. Cl.$^6$ .................. H03M 13/00; H03M 5/00; H03M 7/00
[52] U.S. Cl. .............. 371/37.1; 371/37.4; 371/37.5; 341/58; 341/59; 360/40
[58] Field of Search .............. 371/37.1, 37.5, 371/37.7, 38.1, 39.1, 40.1, 43, 51.1; 341/58–61, 67, 94, 107; 360/40, 46, 48, 51, 65; 369/48–50, 53, 54, 58–60; 375/263, 265, 266, 290, 340, 341

[56] References Cited

U.S. PATENT DOCUMENTS

| | | | |
|---|---|---|---|
| 4,535,451 | 8/1985 | Drupsteen | 370/99 |
| 4,707,681 | 11/1987 | Eggenberger et al. | 341/59 |
| 4,802,152 | 1/1989 | Markvoort et al. | 369/32 |
| 5,109,385 | 4/1992 | Karp et al. | 371/42 |
| 5,210,536 | 5/1993 | Furlan | 341/107 |
| 5,241,546 | 8/1993 | Peterson et al. | 371/37.1 |
| 5,260,703 | 11/1993 | Nguyen et al. | 341/100 |
| 5,341,249 | 8/1994 | Abbott et al. | 360/46 |
| 5,392,299 | 2/1995 | Rhines et al. | 371/37.5 |
| 5,422,895 | 6/1995 | Nguyen et al. | 371/37.5 |
| 5,506,825 | 4/1996 | Gushima et al. | 369/49 |
| 5,537,112 | 7/1996 | Tsang | 341/59 |
| 5,576,707 | 11/1996 | Zook | 341/58 |
| 5,635,933 | 6/1997 | Fitzpatrick et al. | 341/58 |

OTHER PUBLICATIONS

"Rate 16/17 (0,6/6) Code", *IBM Tech. Discl. Bull.* vol. 31, No. 8, Jan. 1989, pp. 21–23.

Primary Examiner—Reba I. Elmore
Assistant Examiner—Emmanuel L. Moise
Attorney, Agent, or Firm—David B. Harrison

[57] ABSTRACT

A modulation method generates a rate 16/17 (d=0, G=7/I=11) modulation code for transferring user digital data bytes having a three-way ECC interleave through a data transfer channel in accordance with the steps of:

shuffling the user data bytes in order to rearrange an order of the bytes in a predetermined manner and putting out $A_iB_i$ byte pairs, encoding eight bits of the Ai bytes of the AiBi byte pairs in accordance with a predetermined rate 8/9 modulation code to produce nine code bits a0–a8, and interleaving the nine code bits a0–a8 of each Ai byte with eight unencoded bits of each Bi byte in accordance with a predetermined bitwise interleave pattern to generate the rate 16/17 modulation code. A preferred code and circuitry for the modulation method are also described.

13 Claims, 3 Drawing Sheets

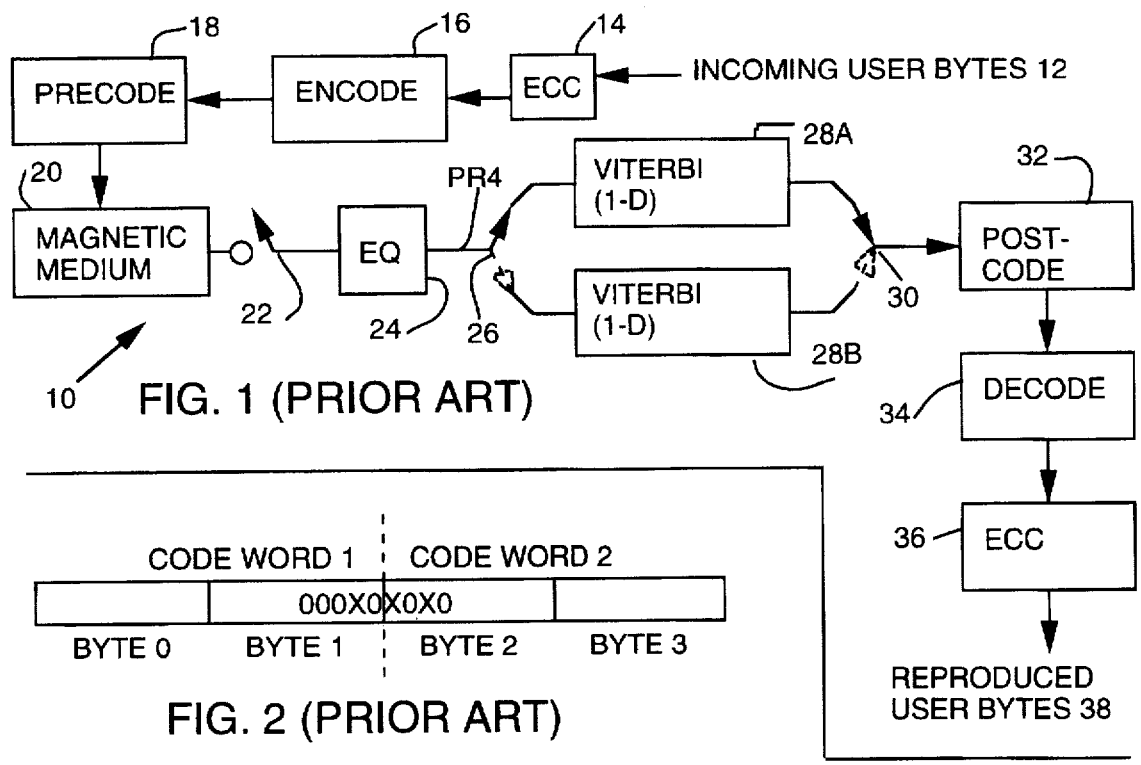
FIG. 1 (PRIOR ART)
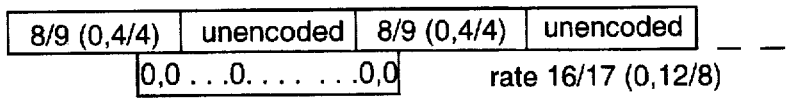
FIG. 2 (PRIOR ART)
FIG. 3 (PRIOR ART)
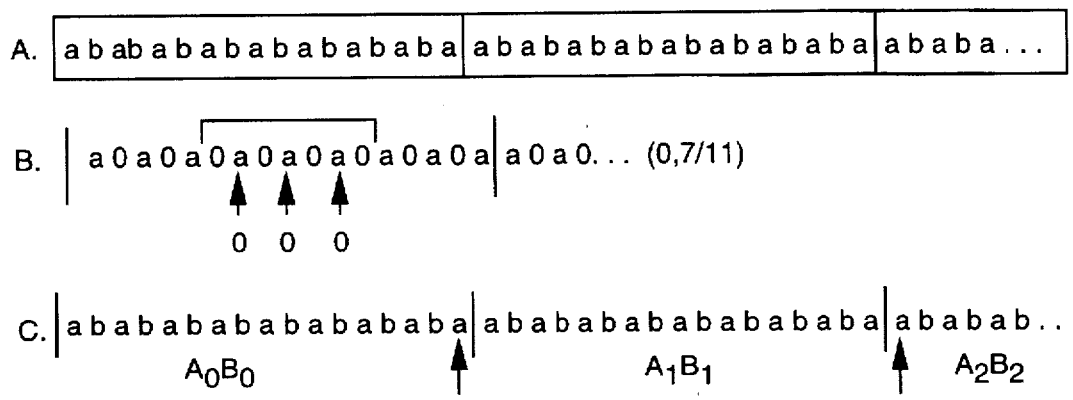
FIG. 4

BIT-INTERLEAVED RATE 16/17 MODULATION CODE WITH THREE-WAY BYTE-INTERLEAVED ECC

FIELD OF THE INVENTION

The present invention relates to channel modulation codes and methods. More particularly, the present invention relates to a rate 16/17 channel code compatible with lowered-overhead, three-way interleaved ECC.

BACKGROUND OF THE INVENTION

Modulation codes have been employed within magnetic recording channels in order to achieve a more even distribution of magnetic flux transitions within a data track in view of data patterns of particular user information being encoded and recorded. In particular, run length limited (RLL) modulation codes have been employed within partial response signaling, maximum likelihood detection (PRML) data recording and playback channels, decision feedback equalization (DFE) channels, and fixed delay tree search (FDTS) channels.

Partial response channels of interest for magnetic data storage devices include a (1-D) dicode channel, a PR4 $(1-D^2)$ channel and an EPR4 $(1+D-D^2-D^3)$ channel. In these systems Viterbi detectors are frequently employed to achieve maximum likelihood detection of user data being played back from the recording medium. A modulation code for a PRML data recording and playback channel is selected to balance code efficiency against timing/gain loop reliability and Viterbi detector path memory.

At the same time, error correction code (ECC) techniques are employed in order to detect, locate and correct error bursts within a data stream received as play back from the magnetic recording channel. In order to perform ECC, an encode process appends ECC remainder bytes to the unencoded data stream prior to encoding, precoding and recording. During playback, following postcoding, and modulation decoding the remainder bytes are checked in each ECC interleave for errors. If one or several burst errors are determined to be present, the remainder bytes are employed by ECC processes to locate and correct the error burst(s). The number of ECC remainder bytes is a function of the number of interleaves, the sector or block length, and of the robustness of the ECC process in locating and correcting multiple burst errors (errors spanning plural data interleaves). The interested reader is referred to Peterson and Weldon, *Error-Correcting Codes*, Second Edition, The MIT Press, Cambridge, Mass., (©1972, and also to commonly assigned U.S. Pat. No. 5,241,546 to Peterson et al., entitled: "On-The-Fly Error Correction with Embedded Digital Controller", the disclosure thereof being incorporated herein by reference. This patent explains the division of a user data block of e.g. 512 bytes into three ECC interleaves, wherein interleaves 1 and 2 each contains e.g. 171 data bytes, and interleave 3 contains e.g. 170 data bytes. ECC interleave 1 includes e.g. bytes [1], [4], [7], [10]... etc.; interleave 2 includes e.g. bytes [2], [5], [8], [11]. . etc.; and, interleave 3 includes e.g. bytes [3], [6], [9], [12]. . . . etc. In effect, each interleave becomes its own error correction channel having its own remainder bytes. By employing interleaves within the ECC process, the ECC symbol length is shortened (e.g. 512 bytes to 171 or 170 bytes), which in turn reduces the complexity of the error correction process, simplifies the implementing hardware/firmware, speeds up execution of corrections, and accommodates single burst error lengths of up to three bytes.

For example, FIG. 1 illustrates a conventional PRML magnetic recording channel including ECC. A stream 12 of incoming user data bytes is subjected to ECC encoding within an ECC encoder 14 which appends remainder bytes for each interleave at the end of each data block. Cross-check bytes may also be appended by the ECC encoder 14 for purposes explained in commonly assigned U.S. Pat. No. 5,422,895 issued on Jun. 6, 1995, entitled: "Cross-Checking for On-The-Fly Reed Solomon Error Correction Code", the disclosure thereof being incorporated herein by reference. Each data block is then encoded in accordance with desired modulation code, such as a rate 8/9 code, by an encoder 16. A precoder 18 then precodes the data in order to conform it to a predetermined spectrum, such as partial response, class IV (PR4) for example. The encoded and precoded blocks are then recorded by digital saturation recording onto a magnetic storage medium 20.

During playback, analog data is low pass filtered and sampled by an analog to digital conversion process 22 and equalized to the PR4 spectrum by analog and/or digital filtering 24. Because PR4 is present, the data is essentially interleaved, and a selector 26 directs equalized samples alternately to two Viterbi detectors 28A and 28B. The Viterbi detectors perform maximum likelihood detection of the interleaved sample sequences, and a downstream selector 30 reassembles the detected binary values into code words which are then post-coded by a post-coder 32, and decoded by a decoder 34, and then checked in an ECC decoder 36 to see if any error bursts are present. If not, the decoded data bytes 38 are delivered to a requesting process. If one or more error bursts are detected, the ECC process 36 then begins a correction process not directly pertinent to the present invention. One example of a prior art magnetic recording and playback channel is provided in commonly assigned U.S. Pat. No. 5,341,249 entitled: "Disk Drive Using PRML Sampling Data Detection with Digital Adaptive Equalization", the disclosure thereof being incorporated herein by reference.

The relevant technical literature provides examples of rate 8/9 (d=, G=4/I=4; ) modulation codes, see e.g. U.S. Pat. No. 4,707,681 and commonly assigned U.S. Pat. No. 5,260,703. These patents describe the utility and advantages of rate 8/9 modulation codes within the field of magnetic recording. As the code rate approaches unity, the code is deemed to be more efficient, in that relatively fewer code characters are required to encode user data values. Thus, a rate 8/9 code is more efficient than a rate 2/3 code. Similarly, a rate 16/17 code is more efficient than a rate 8/9 code. For example, a rate 16/17 (=0.941) modulation code achieves an approximately six percent (6%) increase in recording density over a standard rate 8/9 modulation code.

While rate 16/17 modulation codes are more efficient than rate 8/9 modulation codes, some rate 16/17 modulation codes have certain drawbacks. For example, the reader is referred to commonly assigned, copending U.S. patent application Ser. No. 08/497,182, filed on Jun. 30, 1995, entitled: "A Rate 16/17 (d=0,G=6/I=7) Modulation Code", now U.S. Pat. No. 5,635,933, for a description of an improved rate 16/17 modulation code (this prior patent is incorporated herein by reference). While this prior approach works very successfully, it requires a four-way ECC interleave, as compared to a three-way ECC interleave for a rate 8/9 (0,4/4) code. The four-way ECC interleave requirement somewhat negates the benefits of the improved rate 16/17 modulation code efficiency, because of the need for extra ECC remainder bytes which increases channel overhead by about one percent (1%). Also, four-way ECC interleave increases the ECC circuitry and expense of implementation.

Since the Viterbi detectors 28A and 28B each include a path memory of predetermined length, every error event can corrupt more than one bit. With a standard PR4 preceding and a PR4 Viterbi detector 28A or 28B, one error event will corrupt two bits, separated by some span of uncorrupted bits. Thus, when a bit becomes corrupted e.g. by misdetection within the Viterbi detector 28A or 28B, a whole codeword becomes corrupted, and if a bit error happened to straddle a codeword boundary, then two codewords would become corrupted.

If a rate 16/17 block code is employed, as exemplified in FIG. 2, a single bit error could corrupt four bytes. So, if there were four bytes of a code word that were corrupted, and the four byte codeword spanned two ECC interleaves, the ECC correction process 36 would consider the single error event and its consequence in the Viterbi detector to constitute a double burst error, which is much more difficult to locate and correct than a single burst error. Thus, in selecting a suitable rate 16/17 modulation code, it is not reasonable to accept a consequence that a single bit corruption would lead to a corruption of a number of bytes spanning error correction interleaves.

FIG. 3 illustrates one known rate 16/17 modulation code which interleaves rate 8/9 (0,4/4) code bytes with unencoded bytes. One practical drawback of this code is that its characteristics are (0,12/8) meaning that while each interleave is 8 bits long, the maximum zero run length is 12 bits (clock cells or positions), a run length which is unduly long and may lead to loss of timing synchronization and phase lock by the sampling loop which controls timing for taking the digital samples of the signal recovered from the magnetic medium. For example, in FIG. 3, if an unencoded data byte happened to be all zeros, and the last two bits of a leading code word were also zeros, and the first two bits of a trailing code word were zeros (both conditions being within the coding constraints of the rate 8/9 (0,4/4) modulation code), a maximum uninterrupted string of zeros would equal 12.

Thus, a hitherto unsolved need has remained for a rate 16/17 modulation code having reasonable zero run-length properties and which enables use of three-way interleaved ECC.

SUMMARY OF THE INVENTION WITH OBJECTS

A general object of the present invention is to provide a new rate 16/17 (d=0,G=7/I=11) modulation code overcoming limitations and drawbacks of the prior art.

A more specific object of the present invention is to provide a rate 16/17 modulation code employing bit-wise interleaving of code words and byte reordering in order to achieve reasonable run-length properties while requiring only three-way interleaved ECC in a manner overcoming limitations and drawbacks of the prior art.

Another object of the present invention is to provide a rate 16/17 modulation code which limits single bit errors to consequences approaching those occurring within a conventional rate 8/9 (0,4/4) modulation code in response to single bit errors.

One more object of the present invention is to provide a rate 16/17 modulation code which includes a rate 8/9 RLL(0,3) modulation codewords without interleave constraint which are bit-interleaved with uncoded bytes.

In accordance with principles of the invention, a method for generating a rate 16/17 modulation code for transferring user digital data bytes having a three-way ECC interleave through a data transfer channel comprises the steps of:

shuffling the user data bytes in order to rearrange an order of the bytes in a predetermined manner and putting out $A_iB_i$ byte pairs, encoding eight bits of the Ai bytes of the AiBi byte pairs in accordance with a predetermined rate 8/9 modulation code to produce nine code bits a0–a8, and interleaving the nine code bits a0–a8 of each Ai byte with eight unencoded bits of each Bi byte in accordance with a predetermined bitwise interleave pattern to generate the rate 16/17 modulation code.

These and other objects, advantages, aspects and features of the present invention will be more fully understood and appreciated upon consideration of the following detailed description of a preferred embodiment, presented in conjunction with the accompanying drawings.

BRIEF DESCRIPTION OF THE DRAWINGS

In the Drawings:

FIG. 1 is a simplified block diagram of a conventional PRML magnetic recording and playback channel.

FIG. 2 is a diagram of a single error event which becomes propagated across multiple code words and ECC interleaves, thereby presenting a multiple burst error condition to an ECC process.

FIG. 3 is a diagram of a prior rate 16/17 (0,12/8) modulation code having less than desirable zero run length properties.

FIG. 4 is a set of graphs illustrating implementation of a rate 16/17 modulation code in accordance with principles of the present invention.

DETAILED DESCRIPTION OF A PREFERRED EMBODIMENTS

Figure 5:
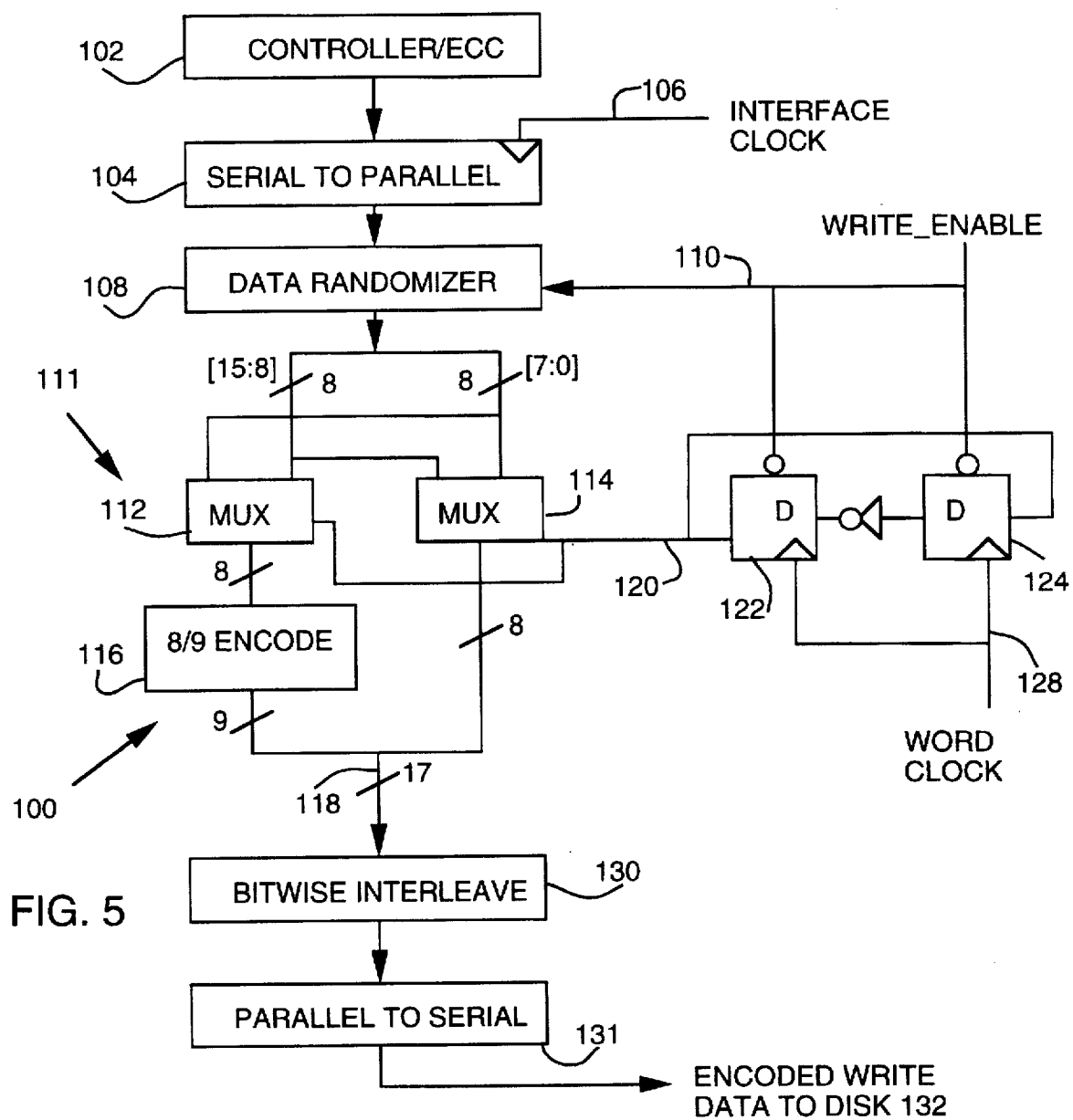
FIG. 5 is a block diagram of an encoding process for a magnetic recording channel incorporating principles of the present invention.

In order to understand the present invention, it should be appreciated that the Viterbi detectors 28A and 28B of FIG. 1 are actually two independent channels. Accordingly, if one of the Viterbi detectors 28 makes an error, it will occur in one channel, but not in both channels. If, for example, all of the even bits were within one channel; and, all of the odd bits were in the other channel, then an error event occurring in the even bit stream in the one channel, even at a location straddling a codeword boundary, the data would only be corrupted in the even bit stream in the one channel, and not in the other channel.

Three fundamental steps are taken in order to realize a desired rate 16/17 modulation code having reasonable zero run length properties as well as enabling use of three-way interleaved ECC. First, codewords are interleaved on a bit-by-bit ("bitwise") basis. Second, the codewords to be interleaved must have certain desired properties. Third, byte reordering is carried out.

Once bitwise encoding is envisioned, the codewords must be chosen. One likely candidate is to interleave on a bitwise basis a codeword in accordance with the rate 8/9 RLL (0,4/4) code described in commonly assigned U.S. Pat. No. 5,260,703 with an unencoded codeword (e.g. byte), which produces a new rate 16/17 modulation code.

In the (0,4/4) code, the zero specifies the minimum number of zeros (timing cells or units having no transition) between successive ones (cells having transitions), the first four specifies the maximum number of consecutive ones, and the second four specifies the maximum number of cells in an interleave. If A represents a bit of a rate 8/9 (0,4/4) codeword (nine bits) and U represents a bit of an unencoded codeword (eight bits), then graph A of FIG. 4 illustrates three bitwise interleaved codewords in accordance with the new rate 16/17 modulation code.

It will be appreciated by those skilled in the art that only the global runlength constraint of the original (0,4/4) code is significant in the new code illustrated in graph A of FIG. 4. Accordingly, an RLL (0,3) code may be employed with certain advantages. The (0,3) code benefits from a tighter global runlength constraint because the interleave constraint has been eliminated. Also, the (0,3) encoder/decoder is structurally simpler than the (0,4/4) encoder/decoder described in U.S. Pat. No. 5,260,703 referenced above, and this increased simplicity will help to offset a modest increase in complexity caused by the new interleave/deinterleave circuit.

One can assume that the worst-case runs of zeros occur when the unencoded words are always zero, i.e. U=0. Since at most only three consecutive bits within the encoded codeword (A bits) can be zero because of the maximum zero run length of three, the maximum global run length of zeros for the new code is seven. This occurs when four unencoded zeros are interleaved with three encoded zeros, as shown in graph B of FIG. 4. The maximum run of zeros in each interleave of the code is 11, which can occur when 8 unencoded zeros are concatenated with three encoded zeros within the same interleave, also as graphed in graph B of FIG. 4. Thus, the new rate 16/17 modulation code has the desirable properties of (d=0, G=7/I=11).

Bitwise interleaving is effective because errors normally do not occur simultaneously in both odd and even bit interleaves due to the fact that partial response, class IV (PR4) uses the two interleaved Viterbi detectors 28A and 28B, shown in FIG. 1. Thus, the odd and even bitstreams are relatively independent. It would be very unlikely to have an error event which both straddled a codeword boundary and occurred simultaneously in both interleaves. In the unlikely event of a straddling event in both interleaves, four bytes would be corrupted.

In order for the three-way interleaved ECC to work properly with the new rate 16/17 RLL(0,7/11) modulation code, the following steps are carried out in order to alternate between encoding (rate 8/9) the even and odd bytes and then bitwise interleaving bits into resultant codewords:

1. Unencoded incoming user bytes $U_0$ $U_1$ $U_2$ $U_3$ $U_4$ $U_5$ $U_6$ $U_7$, etc. are shuffled to:

$U_0$ $U_1$ $U_3$ $U_2$ $U_4$ $U_5$ $U_7$ $U_6$, etc.

(This shuffle pattern applies to a three-way ECC interleave; a four-way ECC interleave will have a different shuffle pattern.)

2. The shuffled bytes are then selectively encoded as follows:

$A_0$ $B_0|A_1$ $B_1|||A_2$ $B_2|A_3$ $B_3|||$ . . . , where $A_i$ represents rate 8/9 RLL (0,3) encoded bytes and wherein Bi represents unencoded bytes.

3. The selectively encoded AiBi codewords are then bitwise interleaved into the following sequence:

ababababababababa|abababababababababa|ababababababababa
   . . . . etc.

It is to be understood that $U_0$, $U_1$, etc., is the sequence of user bytes from the controller 102; $A_0$, $A_1$, etc|, are rate 8/9 RLL(0,3) encoded bytes from the 8/9 encoder 116 and $B_1$, $B_2$, etc., are unencoded user bytes, and pairs of the $A_iB_i$ bytes become bitwise interleaved within the bitwise interleave process 130, described below in connection with FIG. 5.

Typical byte error sequences resulting from a PR4 detection with a PW50/T<2.2 (approx.) are $B_0A_1$, $A_0B_1$, $A_0B_1A_2$, $B_1A_2$, and $A_1B_2A_3$. An error sequence in codewords $A_0B_0$, $A_0B_1$, $A_1B_1$, and $A_2B_2$ are shown in graph C of FIG. 4. Thus, in graph C, if an error occurs at a last bit position in the $A_0B_0$ codeword, and the B1 byte contains all zeros, it is possible that the error would propagate over the $A_1B_1$ codeword to corrupt the first bit of the $A_2B_2$ codeword, at the locations shown by the two arrows in FIG. 4c. By inspecting the resulting decoded $U_i$ sequence in each case, it can be seen that these error sequences never corrupt more than one byte per ECC interleave. One interesting error case is $A_iB_{i+1}A_{i+2}$, where ECC interleaves 0 and 2 are corrupted with errors $A_i$ and $B_{i+1}$, and interleave 1 is corrupted with error $A_{i+2}$. However, in the less likely case of simultaneously corrupting both (Viterbi channel) interleaves, at worst case four bytes will become corrupted. In most cases only three bytes will be impacted.

Figure 7:
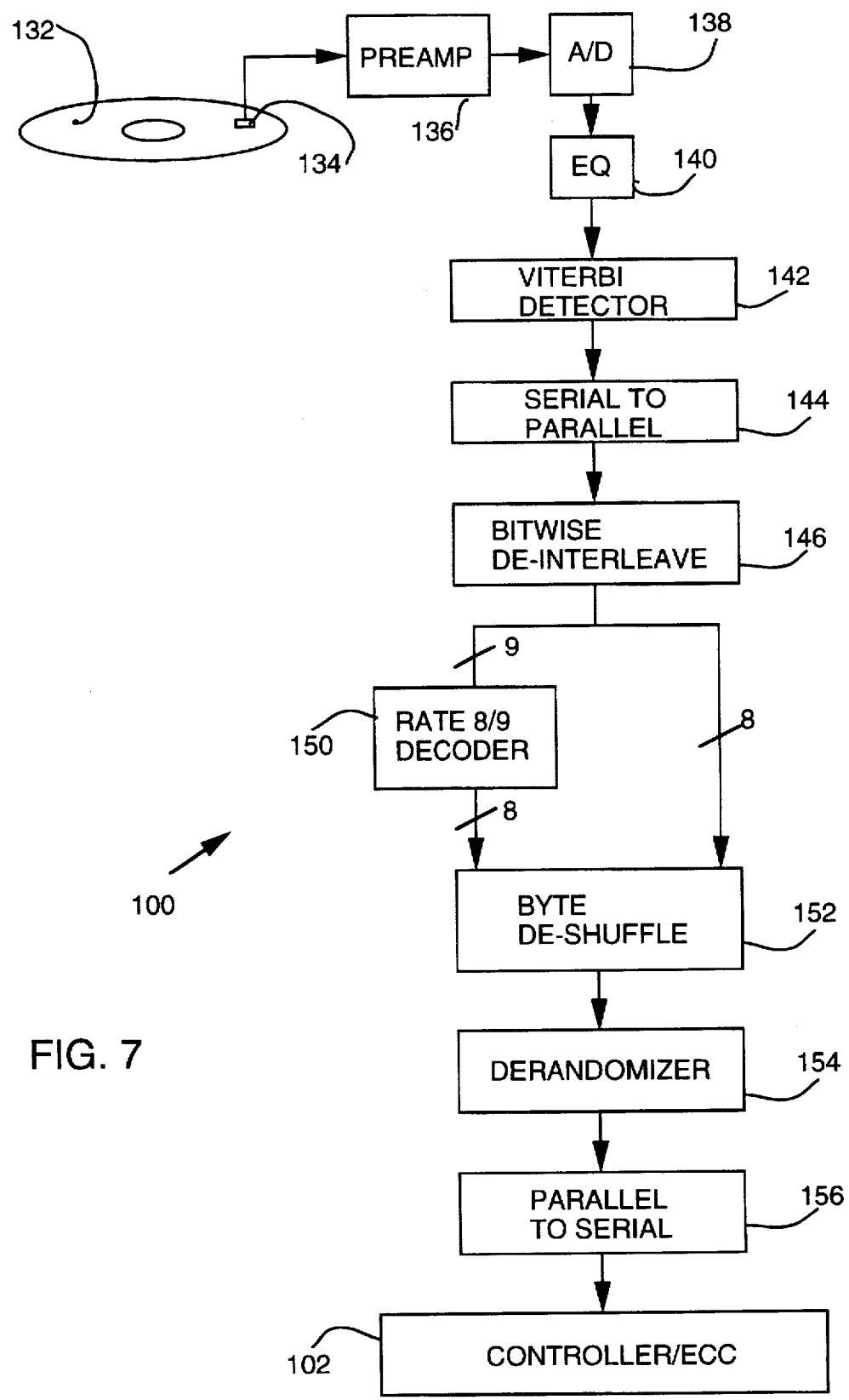
FIG. 7 is a block diagram of a decoding process for the magnetic recording channel illustrated in FIG. 5, incorporating principles of the present invention.

FIGS. 5 and 7 respectively illustrate pertinent portions of an encode path and a decode path within a PRML magnetic recording channel. While a disk channel is illustrated, a tape channel is readily within the contemplation of the present invention. User data bytes are received into a data controller 102 from a source, such as a digital computer (not shown) to which the magnetic recording channel is operatively attached. During an encoding operation in which one or more blocks of user data bytes are to be recorded to a magnetic storage medium, such as a rotating magnetic disk 132, the controller 102 passes the user bytes through an ECC encoder which appends e.g. ECC remainder bytes for each one of three ECC interleaves, and puts out each data block and its appended ECC remainder bytes as a stream of e.g. 4-bit nibbles which are accumulated in a serial to parallel converter 104 into e.g. 16 bit words. The accumulated words are clocked out of the converter 104 by an interface word clock asserted via a path 106. A data randomizer 108 then randomizes the user bytes in a one-to-one mapping in known fashion to remove recurrent data patterns and to present a more evenly randomized sequence to a subsequent encoding process. The data randomizer 108 is enabled by a WRITE_ENABLE control asserted over a path 110.

The 16 bit word output from the data randomizer 108 is divided into two byte-wide paths, each of which is supplied as inputs to two multiplexers 112 and 114 which together shuffle the bytes from U0 U1 U2 U3 . . . etc., to U0 U1 U3 U2 . . . . etc., as explained above. Shuffled bytes selected by the multiplexer 112 are then sent through an 8/9 RLL (0,3) encoder 116 which encodes each 8-bit byte into nine bits which are put out as nine high order coded bits [16:8] onto a path 118. Shuffled bytes selected by multiplexer 114 are put out as eight low order unencoded bits [7:0] onto the path 118. A byte shuffle control on a path 120 is provided for controlling the multiplexers 112 and 114. The byte shuffle control is generated by a logic array comprising two D flip-flops 122 and 124, and a feedback inverter 126 connected as shown in FIG. 5. The registers 122 and 124 are clocked by a word clock signal on a path 128, and are cleared by the write_enable signal on the path 110.

Figure 6:
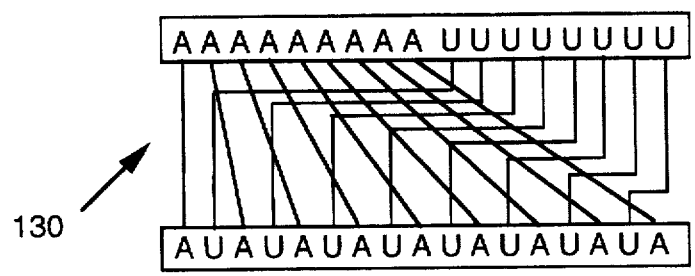
FIG. 6 is a block diagram of a bitwise interleave process within the encoding process of FIG. 5 incorporating principles of the present invention.

The 17 bit shuffled word is then applied to a bitwise interleave circuit 130, shown functionally in FIG. 6. The bitwise interleave circuit 130 interleaves the bits of the incoming 17 bit word into bitwise interleaved codewords shown in graph A of FIG. 4. A parallel to serial converter 131 then converts each bitwise interleaved codeword into a serial bit stream which is supplied via suitable write precompensation/driver/head select circuitry to a recording element 134 which writes the bit stream onto the magnetic storage medium, such as disk 132 via conventional current saturation recording technology.

Turning to FIG. 7, during playback, the magnetic transducer element 134 (which may include a magnetoresistive read element) reads a flux pattern representing the recorded bit stream. A preamplifier 136 preamplifies the analog signal. A sampler, such as an analog to digital converter 138 then synchronously samples the analog signal to produce a sequence of discrete samples. Equalization, e.g. to the PR4 spectrum, occurs either upstream of the sampler, or downstream of the sampler (or both locations as taught in commonly assigned U.S. Pat. No. 5,341,249 entitled: "Disk Drive Using PRML Sampling Data Detection with Digital Adaptive Equalization", the disclosure thereof being incorporated herein by reference). A digital equalizer 140, such as a FIR filter, is shown in FIG. 7. A Viterbi detector 142 includes two internal Viterbi detectors, such as the detectors 28A and 28B as shown in FIG. 1.

Following Viterbi detection and merging of the two Viterbi interleaves, a serial to parallel converter 144 converts the resultant data stream into 17 bit codewords. A bitwise de-interleave process 146 then follows as an inverse of the process of the bitwise interleave process 130. The resultant data words comprise AiBi bytes in which the rate 8/9 encoded Ai bytes are then passed through an 8/9 decoder 150 while the unencoded Bi bytes are not decoded. The resultant 16 bit Ui and Ui+1 bytes are then deshuffled in a byte deshuffler 152 which operates as an inverse of the byte shuffler 111, and they are then derandomized in a data derandomizer 154 which operates as an inverse of the data randomizer 108 to provide unscrambled user bytes. The user bytes are then converted into e.g. 4-bit nibbles within a parallel to serial converter 150 and are fed back into the controller 102 which includes an ECC decoder for recovering and checking the ECC remainder bytes appended for each of the three ECC interleaves. If no errors are discovered, the bytes are ready for delivery to the requesting process.

Here follows a description in Verilog programming language of logic equations for implementing the rate 8/9 (0,3) encoder 116 (in which a resultant block code does not include the following words: 111111111, 101010101, 010101010, 001001001, 010010010, and wherein "&"= AND; "↑"=OR; "^"=XOR; and, "!"=NOT logical operations):

```
input [7:0] inword;
output [8:0] outword;
wire bad,b0,b1,b2,b3,b4,d0,d1,e0,e1;
wire m1,m2,m3,m4,m5;
assign b0 = !(inword[0]|inword[1]|inword[2]|inword[3]);
assign b1 = !(inword[1]|inword[2]|inword[3]|inword[4]);
assign b2 = !(inword[2]|inword[3]|inword[4]|inword[5]);
assign b3 = !(inword[3]|inword[4]|inword[5]|inword[6]);
assign b4 = !(inword[4]|inword[5]|inword[6]|inword[7]);
assign bad = b0|b1|b2|b3|b4;
assign e0 = inword[7]&bad;
assign e1 = !inword[7]&bad;
assign d0 = inword[0]|inword[1];
assign d1 = !inword[0]&!inword[1]&!inword[2]&inword[3];
assign m1 = inword[0]&inword[1]&inword[2]&inword[3]&inword[4]
    &inword[5]&inword[6]&inword[7];
assign m2 = inword[0]&!inword[1]&inword[2]&!inword[3]
```

-continued

```
    &inword[4]&!inword[5]&inword[6]&!inword[7];
assign m3 = !inword[0]&!inword[1]&!inword[2]&!inword[3]
    &!inword[4]&!inword[5]&!inword[6]&inword[7];
assign m4 = !inword[0]&!inword[1]&inword[2]&!inword[3]
    &!inword[4]&inword[5]&!inword[6]&!inword[7];
assign m5 = !inword[0]&inword[1]&!inword[2]&!inword[3]
    &!inword[4]&!inword[5]&!inword[6]&!inword[7];
assign outword[0] = (inword[0]((!inword[1]&inword[2]&bad))^
    (m3|m4|m5);
assign outword[1] = (inword[1]|b0|(!inword[0]&!inword[1]&
    !inword[2]&inword[3]&bad))^(m2|m4);
assign outword[2] = ((b0&inword[5])|(inword[2] & (inward[0]|
    (inword[1]&!bad)|(inword[1]&bad&!inword[5])))|
    (!inword[0]&!inword[1]&(inword[2]|(inword[3]
    &!bad))))^(m3|m4);
assign outword[3] = ((d0&(inword[3]|e0))|(!inword[0]&!inword[1]
    &inword[3]&(inword[2]|bad|(!bad&inword[7])))|
    (b0&inword[7]))^(m2|m3|m4);
assign outword[4] = ((inword[4]&(!bad|b0))|(e1&(inword[0]|
    inword[1]))|(d1&bad))^(m3|m4);
assign outword[5] = ((inword[5] & (!bad|inword[0]))|b0|
    (!inword[0]&!inword[1]&inword[2]&
    !inword[7]&bad))^(m2|m5);
assign outword[6] = ((inword[6]&(!bad|inword[0]|inword[1]|b0))|
    (!inword[0]&!inword[1]&bad&(inword[2]&inword[7]|
    !inword[2]&inword[3])))^(m2|m3|m4|m5);
assign outword[7] = (inword[7]|d1|bad)^(m2|m4);
assign outword[8] = (!bad&!d1)^(m1|m2|m4).
```

Here follows a description in the Verilog programming language of logic equations for implementing the rate 8/9 (0,3) block code decoder 150:

```
input [8:0] inword;
output [7:0] outword;
wire c1,n,n1,n2,n3,n4,n5;
assign c1 = !inword[1]&inword[2]&!inword[4]&inword[5];
assign n = inword[0]&inword[1]&inword[4]&inword[5]&
    inword[7]&!inword[8];
assign n1 = n & inword[2]&inword[3]&inword[6];
assign n2 = n & !inword[6];
assign n3 = n & inword[2]&!inword[3];
assign n4 = n & !inword[2]&inword[3];
assign n5 = n & !inword[2]&!inword[3];
assign outword[0] = ((inword[0] & (inword[8]|!(!inword[1]&
    inword[2]&(inword[5]|inword[6]))))&!n) ^n1|n2;
assign outword[1] = ((inword[1] & (inword[8]|inword[0]|
    (!inword[5]&!(inword[4]&inword[3]&inword[6]))))
    &!n) ^n1|n5;
assign outword[2] = ((inword[2] & (inword[8]|inword[0]|
    (inword[1]&!inword[5])))&!n) ^n1|n2|n4;
assign outword[3] = (((inword[3] & (inword[8]|(inword[0]&
    (inword[4]|inword[2]&(inword[5]|inword[6])))))|
    (!inword[0]&!inword[8]& (!inword[1]&inword[2]|
    inword[1]&!inword[5]&inword[3]&inword[4])))&!n) ^n1;
assign outword[4] = ((inword[4] & (inword[8]|(!inword[0]&
    ((!inword[1]&inword[2])|(inword[1]&inword[5])))))
    &!n) ^n1|n2;
assign outword[5] = ((inword[5] & (inword[8]|(!inword[0]&!inword[1]
    &inword[2])|(inword[0]&!c1|(!inword[0]&inword[1]
    &inword[2])))&!n) ^n1|n4;
assign outword[6] = ((inword[6] & (inword[8]|(!inword[0]&!inword[1]
    &inword[2])|(inword[0]&!(!inword[1]&inword[2]))|
    (!inword[0]&inword[1]&!(!inword[5]&inword[4]
    &inword[3]))))&!n) ^n1|n2;
assign outword[7] = (((inword[7] & (inword[8]|(inword[3]&
    !inword[0]&((inword[1]&inword[5])|(!inword[1]&
    inword[2])))|(!inword[8] & !inword[4]&((!inword[0]
    &inword[1]&!inword[5])|(inword[0]&!(inword[2]&
    inword[5])))))&!n) ^n1|n3.
```

Having thus described an embodiment of the invention, it will now be appreciated that the objects of the invention have been fully achieved, and it will be understood by those skilled in the art that many changes in construction and widely differing embodiments and applications of the invention will suggest themselves without departing from the

What is claimed is:

1. A method for generating a rate 16/17 modulation code for transferring user digital data bytes having a three-way ECC interleave through a data transfer channel comprising the steps of:

shuffling the user data bytes in order to rearrange an order of the bytes in accordance with $U_0\ U_1\ U_2\ U_3\ U_4\ U_5\ U_6\ U_7, \ldots$ to: $U_0\ U_1\ U_3\ U_2\ U_4\ U_5\ U_7\ U_6, \ldots$, and putting out $A_iB_i$ byte pairs of shuffled user bytes, encoding eight bit Ai bytes into nine-bit rate 8/9 RLL (d=0,k=3) modulation code symbols to produce nine code bits a0–a8, wherein Bi represents unencoded bytes, and interleaving the nine code bits a0–a8 of each Ai byte with eight unencoded bits of each Bi byte in accordance with a predetermined bitwise interleave pattern comprising abababababababala bababababababababala babababababababala . . . , where "a" represents a bit position within an encoded nine-bit symbol Ai, and where "b" represents a bit position within an unencoded byte Bi, to generate the rate 16/17 modulation code having three-way ECC interleave.

2. The method set forth in claim 1 comprising the further steps of: converting the generated rate 16/17 modulation code into a serial bit stream and recording the serial bit stream upon a magnetic data storage medium.

3. The method set forth in claim 2 comprising the further step of randomizing the bits of the user data bytes in a known manner before the shuffling step.

4. The method set forth in claim 3 comprising the further steps of:

playing back the recorded serial bit stream from the magnetic data storage medium to recover recorded information, synchronously sampling the recorded information to produce synchronous samples, equalizing the synchronous samples to a predetermined partial response spectrum to produce equalized synchronous samples, passing the equalized synchronous samples through two interleave Viterbi detectors to provide maximum likelihood estimates of the recorded information and merging the maximum likelihood estimates into recovered codewords, bitwise deinterleaving the recovered codewords inversely of the bitwise interleaving step to produce AiBi recovered byte pairs, decoding the recovered Ai bytes of each byte pair in accordance with an inverse of the nine-bit rate 8/9 RLL (d=0,k=3) modulation code to provided decoded Ai bytes, deshuffling the AiBi decoded byte pairs in accordance with an inverse of the step of rearranging an order of the bytes, and derandomizing inversely of the known randomization manner the deshuffled and decoded AiBi byte pairs, to provide recovered bytes.

5. The method set forth in claim 4 comprising the further step of passing the recovered bytes through a three-way interleaved ECC to recover and check appended ECC remainder bytes to determine if any errors are present in the recovered bytes.

6. The method set forth in claim 2 comprising the following additional steps:

playing back the recorded serial bit stream from the magnetic data storage medium to recover recorded information, equalizing the recorded information to a predetermined partial response spectrum to produce equalized recorded information, synchronously sampling the equalized recorded information to produce synchronous samples, passing the synchronous samples through two interleave Viterbi detectors to provide maximum likelihood estimates of the recorded information and merging the maximum likelihood estimates into recovered codewords, bitwise deinterleaving the recovered codewords inversely of the bitwise interleaving step to produce AiBi recovered byte pairs, decoding the recovered Ai bytes of each byte pair in accordance with an inverse of the nine-bit rate 8/9 RLL (d=0, k=3) modulation code to provided decoded Ai bytes, deshuffling the AiBi decoded byte pairs in accordance with an inverse of the step of rearranging an order of the bytes, to provide recovered bytes.

7. The method set forth in claim 6 comprising the further step of passing the recovered bytes through a three-way interleaved ECC to recover and check appended ECC remainder bytes to determine if any errors are present in the recovered bytes.

8. A modulation code encoder for generating a rate 16/17 modulation code for transferring user digital data bytes having a three-way ECC interleave through a data transfer channel comprising:

a shuffler for shuffling incoming user bytes $U_0\ U_1\ U_2\ U_3\ U_4\ U_5\ U_6\ U_7, \ldots$ to: $U_0\ U_1\ U_3\ U_2\ U_4\ U_5\ U_7\ U_6, \ldots$, and for putting out $A_iB_i$ byte pairs of shuffled bytes, a byte encoder for encoding eight bits of the Ai bytes of the AiBi byte pairs in accordance with a predetermined rate 8/9 modulation code wherein the encoder selectively encodes shuffled bytes into codewords: $A_0B_0|A_1B_1|||A_2B_2|A_3B_3|||\ldots$, wherein Ai represents nine-bit rate 8/9 RLL (d=0,k=3) encoded symbols to produce nine code bits a0–a8, and wherein Bi represents unencoded bytes, and an interleave circuit for interleaving the nine code bits a0–a8 of each Ai byte with eight bits of each unencoded Bi byte in accordance with a sequence:

abababababababala bababababababababala babababababababala . . . , where "a" represents a bit position within an encoded nine-bit symbol Ai, and where "b" represents a bit position within an unencoded byte Bi, to generate the rate 16/17 modulation code.

9. The modulation code encoder set forth in claim 8 further comprising:

a parallel to serial converter for converting the generated rate 16/17 modulation code into a serial bit stream and a recording channel for recording the serial bit stream upon a magnetic data storage medium.

10. The modulation encoder set forth in claim 8 further comprising a data randomizer for randomizing the bits of the user data bytes before the shuffler to randomize the data patterns of the user data bytes in a known manner.

11. The modulation encoder set forth in claim 8 further comprising a modulation decoder connected to the recording channel for playing back the recorded serial bit stream from the magnetic data storage medium to recover recorded information, an equalizer circuit for equalizing the recorded information to a predetermined partial response spectrum to provide equalized recorded information, a synchronous sampler for synchronously sampling the equalized recorded information to produce synchronous samples, two interleave Viterbi detectors through which the synchronous samples are passed in order to provide maximum likelihood estimates of the recorded information a merge circuit for merging the maximum likelihood estimates into recovered codewords, a deinterleaving circuit for bitwise deinterleaving the recovered codewords inversely of the bitwise interleaving function performed by the interleave circuit to produce AiBi recovered byte pairs, a decoder for decoding the recovered Ai bytes of each byte pair in accordance with an inverse of the rate 8/9 modulation code to provided decoded Ai bytes, and a deshuffler for deshuffling the AiBi decoded byte pairs in accordance with an inverse of the step of rearranging an order of the bytes in a predetermined manner, to provide recovered bytes.

12. The circuit set forth in claim 8 further comprising a three-way interleaved ECC through which the recovered bytes are passed in order to recover and check appended ECC remainder bytes to determine if any errors are present in the recovered bytes.

13. The modulation encoder set forth in claim 8 further comprising a modulation decoder connected to the recording channel for playing back the recorded serial bit stream from the magnetic data storage medium to recover recorded information, a synchronous sampler for synchronously sampling the recorded information to produce synchronous samples, an equalizer circuit for equalizing the synchronous samples to a predetermined partial response spectrum to provide equalized synchronous samples, two interleave Viterbi detectors through which the synchronous samples are passed in order to provide maximum likelihood estimates of the recorded information, a merge circuit for merging the maximum likelihood estimates into recovered codewords, a deinterleaving circuit for bitwise deinterleaving the recovered codewords inversely of the bitwise interleaving function performed by the interleave circuit to produce AiBi recovered byte pairs, a decoder for decoding the recovered Ai bytes of each byte pair in accordance with an inverse of the rate 8/9 modulation code to provided decoded Ai bytes, and a deshuffler for deshuffling the AiBi decoded byte pairs in accordance with an inverse of the step of rearranging an order of the bytes in a predetermined manner, to provide recovered bytes.

* * * * *